(12) United States Patent
Rivas Davila et al.

(10) Patent No.: US 8,760,164 B2
(45) Date of Patent: Jun. 24, 2014

(54) MAGNETIC RESONANT IMAGING GRADIENT DRIVER ARCHITECTURE

(75) Inventors: Juan Manuel Rivas Davila, Niskayuna, NY (US); Ljubisa Dragoljub Stevanovic, Niskayuna, NY (US); Juan Antonio Sabate, Niksayuna, NY (US)

(73) Assignee: General Electric Company, Niskayuna, NY (US)

( * ) Notice: Subject to any disclaimer, the term of this patent is extended or adjusted under 35 U.S.C. 154(b) by 319 days.

(21) Appl. No.: 12/696,972

(22) Filed: Jan. 29, 2010

(65) Prior Publication Data

US 2011/0187369 A1    Aug. 4, 2011

(51) Int. Cl.
*G01R 33/385* (2006.01)

(52) U.S. Cl.
CPC .......... *G01R 33/3852* (2013.01); *G01R 33/385* (2013.01)
USPC ............................ 324/322; 324/318; 324/307

(58) Field of Classification Search
USPC .................. 324/300–322; 600/407–435; 382/128–131
See application file for complete search history.

(56) References Cited

U.S. PATENT DOCUMENTS

| | | | | |
|---|---|---|---|---|
| 2,698,389 A * | 12/1954 | Jernakoff | | 250/291 |
| 3,491,286 A * | 1/1970 | Simpson | | 324/304 |
| 3,515,979 A * | 6/1970 | Golay | | 324/319 |
| 5,270,657 A * | 12/1993 | Wirth et al. | | 324/322 |
| 5,530,355 A * | 6/1996 | Doty | | 324/318 |
| 5,663,648 A * | 9/1997 | Chapman et al. | | 324/322 |
| 5,936,851 A * | 8/1999 | Hickman | | 363/17 |
| 5,986,454 A * | 11/1999 | Leifer | | 324/318 |
| 6,291,997 B1 * | 9/2001 | King et al. | | 324/319 |
| 6,441,616 B1 * | 8/2002 | Mansfield | | 324/318 |
| 6,479,997 B1 * | 11/2002 | Westphal et al. | | 324/318 |
| 6,741,483 B1 * | 5/2004 | Stanley | | 363/65 |
| 6,900,638 B1 * | 5/2005 | Yair et al. | | 324/322 |
| 7,116,166 B2 * | 10/2006 | Sabate et al. | | 330/146 |
| 7,142,066 B1 * | 11/2006 | Hannah et al. | | 331/94.1 |
| 7,439,736 B2 * | 10/2008 | Meaney et al. | | 324/307 |
| 7,671,595 B2 * | 3/2010 | Griswold et al. | | 324/322 |
| 7,800,368 B2 * | 9/2010 | Vaughan et al. | | 324/318 |
| 2005/0275404 A1 * | 12/2005 | Sabate et al. | | 324/322 |
| 2008/0231282 A1 * | 9/2008 | Griswold et al. | | 324/322 |
| 2010/0258270 A1 | 10/2010 | Arik et al. | | |
| 2011/0051473 A1 | 3/2011 | Glaser et al. | | |
| 2011/0133874 A1 | 6/2011 | Prabhakaran et al. | | |
| 2011/0187369 A1 * | 8/2011 | Rivas Davila et al. | | 324/318 |
| 2011/0221438 A1 * | 9/2011 | Goodwill et al. | | 324/301 |
| 2011/0291657 A1 | 12/2011 | Davila et al. | | |

* cited by examiner

*Primary Examiner* — Melissa Koval
*Assistant Examiner* — Tiffany Fetzner
(74) *Attorney, Agent, or Firm* — Fletcher Yoder, P.C.

(57) ABSTRACT

Embodiments of the present disclosure include a magnetic resonant imaging (MRI) system including a gradient driver configured to deliver a pulse sequence to gradient coils in the MRI system. The gradient driver may be interleaved, and may include two or more interleaved drivers, such that a high amplitude pulse may be output by operating the two interleaved parts of the gradient driver while spreading the electrical loss and maintaining the thermal stability of the system. In one embodiment, each interleaved driver may be rated to output approximately half a maximum amplitude of a current utilized by the gradient coil, and only one interleaved driver may be in operation if only one interleaved driver is sufficient for delivering a necessary pulse to the coils. Further, the interleaved drivers may alternate in operation to maintain thermal stability in the switching semiconductors of the gradient driver.

18 Claims, 5 Drawing Sheets

MAGNETIC RESONANT IMAGING GRADIENT DRIVER ARCHITECTURE

BACKGROUND

The subject matter disclosed herein relates to magnetic resonance imaging systems and, more particularly, to gradient coil driver configurations in a magnetic resonance imaging system.

The use of medical imaging technologies has become commonplace in the medical community. Such imaging technologies typically allow the acquisition of images which depict the internal structures (internal tissues and organs, bones, and so forth) and/or biochemical functions of a patient without the use of invasive procedures. That is, medical imaging technologies typically allow the internal structures and/or functions of a patient to be observed without surgery or other invasive procedures.

One such medical imaging technology is known as magnetic resonance imaging (MRI). MRI systems typically employ magnetic fields and pulses of radio frequency (RF) energy to generate images based on the gyromagnetic properties of tissues and structures within the body. For example, MRI systems may employ a primary magnetic field to generally orient susceptible molecules (such as hydrogen nuclei in water molecules) within the field and a RF pulse to disrupt this orientation. The reorientation of molecules within the primary magnetic field after this disruption may generate signals that may be detected and used to generate images of the internal structures and/or functions within the patient. Time-varying magnetic gradient fields may also be applied to the subject so that the generated signals may be localized with respect to x-, y-, and z-axes, allowing an image to be generated.

The time-varying magnetic gradient fields may be produced by gradient coils in the MRI system which are driven by pulsed sequences of current having a large dynamic range. The pulsed sequences are typically delivered to the gradient coils by gradient drivers in the MRI system. A gradient driver generally includes an array of semiconductors connected in series and/or parallel which may be stacked to drive a higher amplitude pulse sequence. However, typical configurations of gradient drivers may result in thermal instability and/or electrical losses which decreases the efficiency and/or complicates the design of the MRI system.

BRIEF DESCRIPTION

Embodiments of the present invention include a magnetic resonance imaging (MRI) system. The MRI system includes a gradient coil disposed cylindrically around a scanning volume and two or more interleaved gradient drivers coupled to the gradient coil. Each of the two or more gradient drivers is configured to deliver less than a maximum amplitude of a current utilized by the gradient coil.

Another embodiment provides a magnetic resonance imaging (MRI) system including a gradient coil disposed cylindrically around a scanning volume, a gradient driver coupled to the gradient coil, and control circuitry coupled to the gradient driver. The gradient driver is configured to deliver a pulse sequence to the gradient coil, and includes a first interleaved driver coupled to a second interleaved driver, each including a plurality of switches. The control circuitry is capable of substantially controlling an operation of the first interleaved driver and the second interleaved driver.

Yet another embodiment provides a gradient coil driver for a magnetic resonance imaging system. The gradient coil driver includes a first multi-level driver having a first plurality of switching semiconductors and a second multi-level driver coupled to the first multi-level driver, and the second multi-level driver also includes a second plurality of switching semiconductors. The first multi-level driver is configured to operate either concurrently with or alternately from the second multi-level driver.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
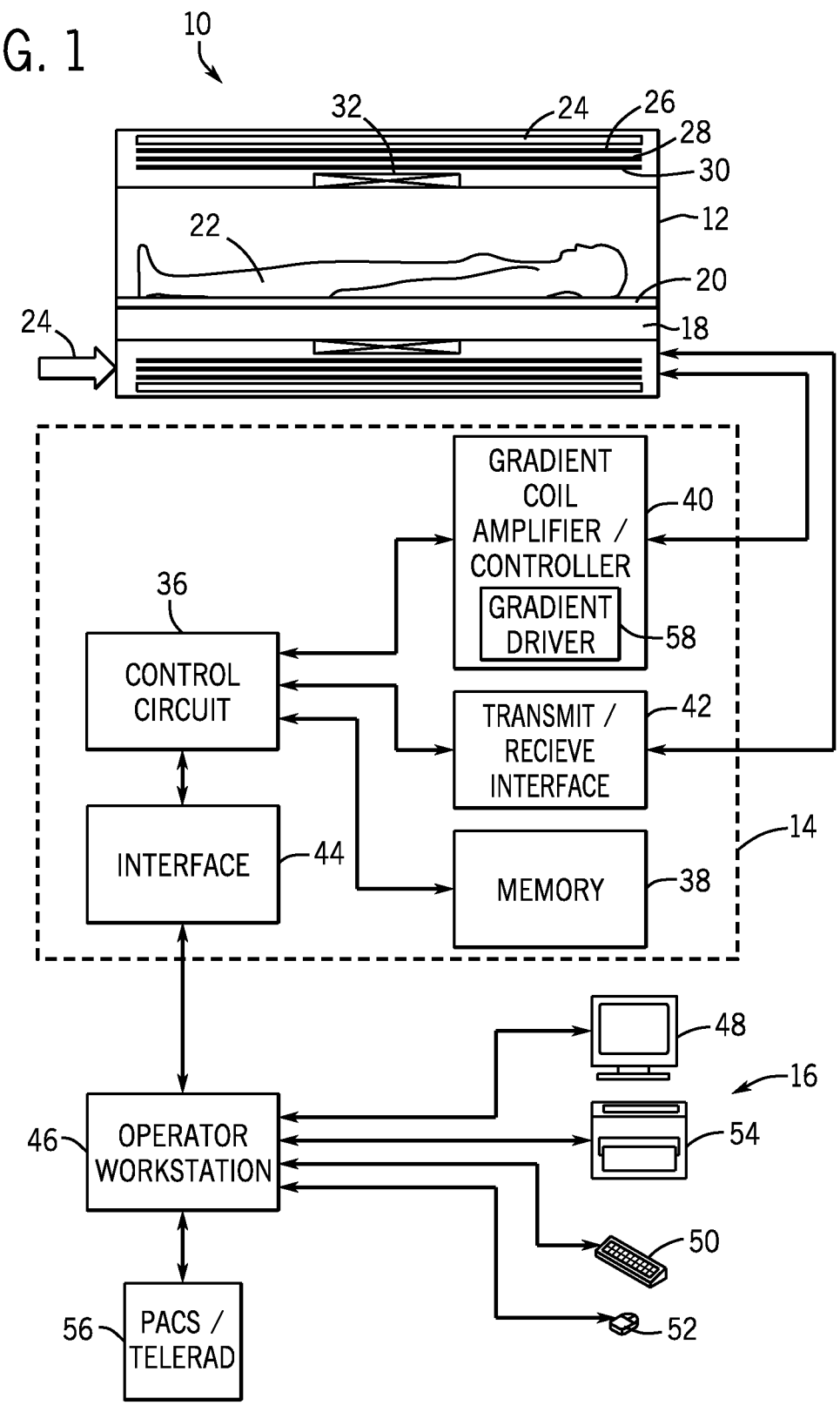
FIG. 1 is a diagrammatical representation illustrating an embodiment of an MRI system that employs multiple multi-level series drivers in accordance with an aspect of the present disclosure.

Turning now to the drawings, and referring first to FIG. 1, a magnetic resonance imaging (MRI) system 10 is illustrated diagrammatically as including a scanner 12, scanner control circuitry 14, and system control circuitry 16. While the MRI system 10 may include any suitable MRI scanner or detector, in the illustrated embodiment the system includes a full body scanner comprising an imaging volume 18 into which a table 20 may be positioned to place a patient 22 in a desired position for scanning. The scanner 12 may additionally or alternatively be configured to target certain anatomy, such as the head or neck.

The scanner 12 may include a series of associated coils for producing controlled magnetic fields, for generating radio frequency (RF) excitation pulses, and for detecting emissions from gyromagnetic material within the patient in response to such pulses. In the diagrammatical view of FIG. 1, a main magnet 24 is provided for generating a primary magnetic field generally aligned with the imaging volume 18. A series of gradient coils 26, 28 and 30 are grouped in one or more gradient coil assemblies for generating controlled magnetic gradient fields during examination sequences as described more fully below. An RF coil 32 is provided for generating RF pulses for exciting the gyromagnetic material. Power may be supplied to the scanner 12 in any appropriate manner, as indicated generally at reference numeral 34. In the embodiment illustrated in FIG. 1, the RF coil 32 may also serve as a receiving coil. Thus, the RF coil 32 may be coupled with driving and receiving circuitry in passive and active modes for receiving emissions from the gyromagnetic material and for applying RF excitation pulses, respectively. Alternatively, various configurations of receiving coils may be provided separate from RF coil 32. Such coils may include structures specifically adapted for target anatomies, such as head coil assemblies, and so forth. Moreover, receiving coils may be provided in any suitable physical configuration, including phased array coils, and so forth.

In a present configuration, the gradient coils 26, 28, and 30 may be formed of conductive wires, bars or plates which are wound or cut to form a coil structure which generates a gradient field upon application of control pulses. The placement of the coils within the gradient coil assembly may be done in several different orders and with varying configurations, and the scanner 12 may further include complementary gradient coils (in the manner described below) to shield the gradient coils 26, 28, and 30. Generally, a z-gradient coil 26 may be positioned at an outermost location, and is formed generally as a solenoid-like structure which has relatively little impact on the RF magnetic field. The gradient coils 28 and 30 may be x-axis and y-axis coils respectively.

The coils 26, 28, 30, and 32 of the scanner 12 may be controlled by external circuitry to generate desired pulsed fields, and to induce signals from the gyromagnetic material in a controlled manner. When the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, the RF coil 32 may generate an RF pulse at or near the Larmor frequency of the material of interest, resulting in rotation of the net aligned moment to produce a net transverse magnetic moment. This transverse magnetic moment precesses around the main magnetic field direction, emitting RF signals that are detected by the scanner 12 and processed for reconstruction of the desired image.

The gradient coils 26, 28, and 30 may serve to generate precisely controlled magnetic fields, the strength of which vary over a predefined field of view, typically with positive and negative polarity. When each gradient coil 26, 28, or 30 is energized with known electric current, the resulting magnetic field gradient is superimposed over the primary field and produces a desirably linear variation in the axial component of the magnetic field strength across the field of view. The field may vary linearly in one direction, but may be homogenous in the other two. The three gradient coils 26, 28, and 30 have mutually orthogonal axes for the direction of their variation, enabling a linear field gradient to be imposed in an arbitrary direction with an appropriate combination of the three gradient coils 26, 28, and 30.

The pulsed gradient fields may perform various functions integral to the imaging process. Some of these functions are slice selection, frequency encoding and phase encoding. These functions can be applied along the x-, y- and z-axes of the original coordinate system or along other axes determined by combinations of pulsed currents applied to the individual field coils.

The slice select gradient field may determine a slab of tissue or anatomy to be imaged in the patient, and may be applied simultaneously with a frequency selective RF pulse to excite a known volume of spins that may precess at the same frequency. The slice thickness may be determined by the bandwidth of the RF pulse and the gradient strength across the field of view.

The frequency encoding gradient, also known as the readout gradient, is usually applied in a direction perpendicular to the slice select gradient. In general, the frequency encoding gradient is applied before and during the formation of the MR echo signal resulting from the RF excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction is accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction.

A great number of variations may be devised for pulse sequences employing the exemplary gradient pulse functions described above, as well as other gradient pulse functions not explicitly described here. Moreover, adaptations in the pulse sequences may be made to appropriately orient the selected slice and the frequency and phase encoding to excite the desired material and to acquire resulting MR signals for processing.

The coils of the scanner 12 are controlled by the scanner control circuitry 14 to generate the desired magnetic field and radiofrequency pulses. In the diagrammatical view of FIG. 1, the control circuitry 14 thus includes a control circuit 36 for commanding the pulse sequences employed during the examinations, and for processing received signals. The control circuit 36 may include any suitable programmable logic device, such as a CPU or digital signal processor of a general purpose or application-specific computer. Further, the control circuit 36 may include memory circuitry 38, such as volatile and/or non-volatile memory devices for storing physical and logical axis configuration parameters, examination pulse sequence descriptions, acquired image data, programming routines, and so forth, used during the examination sequences implemented by the scanner 12.

Interface between the control circuit 36 and the coils of the scanner 12 may be managed by amplification and control circuitry 40 and by transmission and receive interface circuitry 42. The amplification and control circuitry 40 includes amplifiers for each gradient field coil 26, 28, and 30 to supply drive current in response to control signals from the control circuit 36. The amplification and control circuitry 40 may also include a gradient driver 58 configured to deliver the drive current to the gradient field coils 26, 28, and 30. The gradient driver 58 may be implemented as a multi-level converter which may provide different voltages to several switching semiconductors electrically coupled in series. As used herein, the gradient driver 58 may also be referred to as a multi-level converter. In some embodiments, the gradient driver 58 may be configured to reduce electrical loss in the MRI system 10. For example, and as will be further discussed, the gradient driver 58 may be interleaved, and may include two or more multi-level converters to drive the gradient coils.

The receive interface circuitry 42 includes additional amplification circuitry for driving the RF coil 32. Moreover, where the RF coil 32 serves both to emit the RF excitation pulses and to receive MR signals, the receive interface circuitry 42 may include a switching device for toggling the RF coil between active or transmitting mode, and passive or receiving mode. A power supply, denoted generally by reference numeral 34 in FIG. 1, is provided for energizing the primary magnet 24. Finally, the scanner control circuitry 14 includes interface components 44 for exchanging configuration and image data with the system control circuitry 16.

The system control circuitry 16 may include a wide range of devices for facilitating interface between an operator or radiologist and the scanner 12 via the scanner control circuitry 14. In the illustrated embodiment, for example, an operator workstation 46 is provided in the form of a computer workstation employing a general purpose or application-specific computer. The operator workstation 46 also typically includes memory circuitry for storing examination pulse sequence descriptions, examination protocols, user and patient data, image data, both raw and processed, and so forth. The operator workstation 46 may further include various interface and peripheral drivers for receiving and exchanging data with local and remote devices. In the illustrated embodiment, such devices include a monitor 48, a conventional computer keyboard 50, and an alternative input device such as a mouse 52. A printer 54 is provided for generating hard copy output of documents and images reconstructed from the acquired data. In addition, the system 10 may include various local and remote image access and examination control devices, represented generally by reference numeral 56 in FIG. 1. Such devices may include picture archiving and communication systems, teleradiology systems, and the like.

The MRI system 10 may be configured to produce various types of images, including images on various patients and of different locations from patient bodies. Thus, depending on aspects of the MRI system 10, or on characteristics of an application of the MRI system 10, such as an image to be produced, a location on the patient to be imaged, a condition of the patient, etc., different gradient fluxes may be desired. The pulse sequence provided to the gradient coils 26, 28, and 30 should be sufficiently accurate and adjustable such that the coils 26, 28, and 30 may appropriately orient the selected slice and encode the frequency and phase to excite the desired material and acquire resulting signals for processing.

Thus, the quality and resolution of the image produced by the gradient flux may depend on the resolution of the pulse sequence delivered by the gradient driver 58 to the coils 26, 28, and 30. Due to the typical configurations and applications for current MRI systems, gradient coils may sometimes utilize pulse sequences having large amplitudes. Therefore, the ability to deliver a high fidelity and high power pulse sequence may be considered in designing a gradient driver 58. As used herein, the pulse sequence may refer to an output of the gradient driver 58 and the current supplied to the coils 26, 28, and 30 for generating a gradient flux. The pulse sequence may be of variable length and may have any shape in waveform, which may depend on the system 10 or an application of the system 10.

Figure 2:
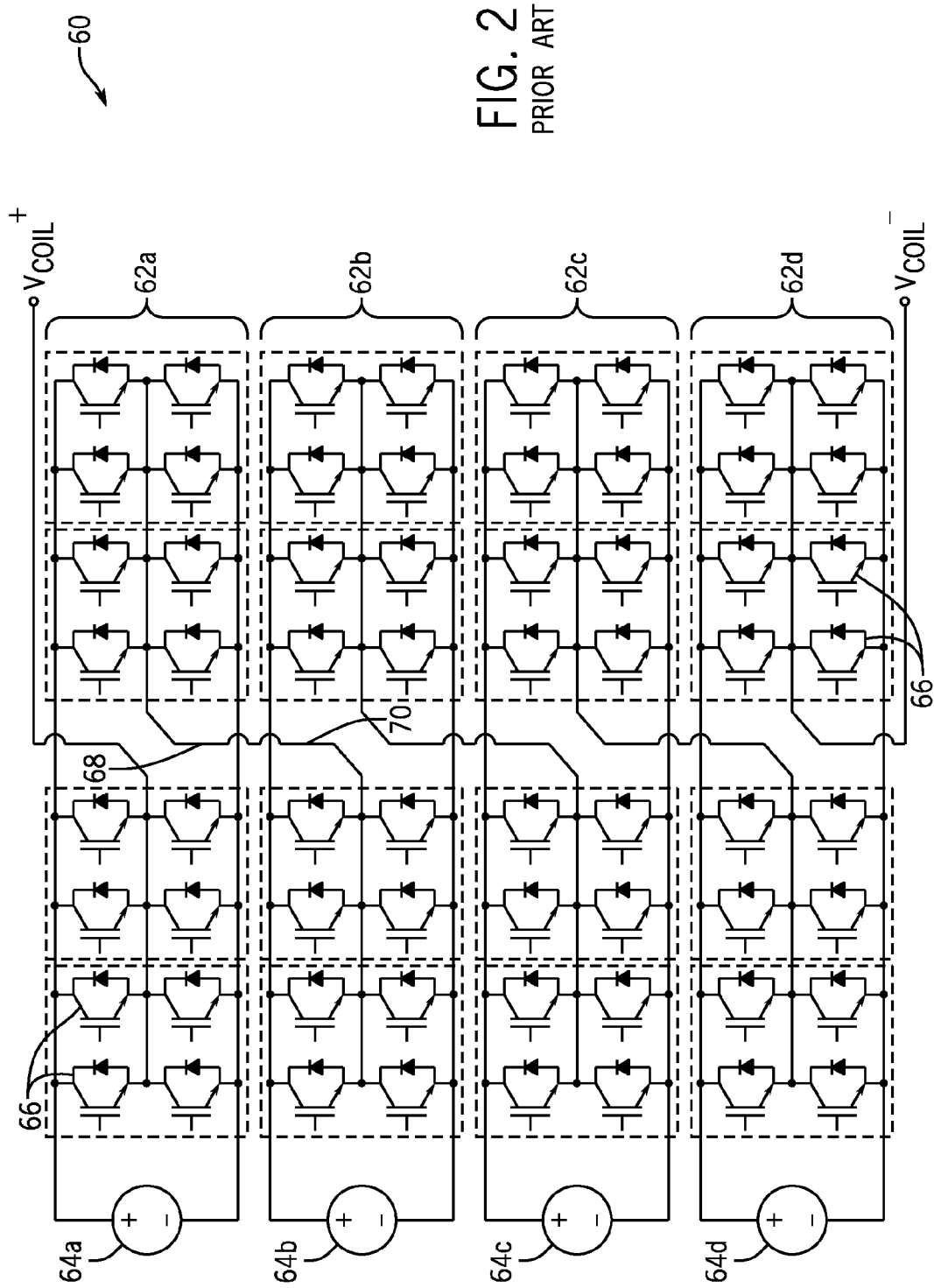
FIG. 2 is a schematic of a configuration for a conventional multi-level series gradient driver.

Some MRI systems have addressed the issue of providing higher power pulse sequences by implementing a multi-level circuit structure. One example of a multi-level series gradient driver 60 is provided in FIG. 2. The multi-level series gradient driver 60 may have multiple levels of driver components 62 stacked together, each having a voltage supply 64 and multiple switching semiconductors 66. A "driver component" such as driver component 62*a* may refer to one level of a multi-level driver 60, and may include one voltage supply 64*a* and multiple switching semiconductors 66. An output 68 of one driver component 62*a* may be connected to an input 70 of an adjacent stacked driver component 62*b* in a multi-level series gradient driver 60. In this configuration, while each voltage supply may be configured to supply approximately 500-700 V, the switching pattern can be adjusted such that approximately 1500 to 2000 V is output to drive the gradient coils.

Figure 3:
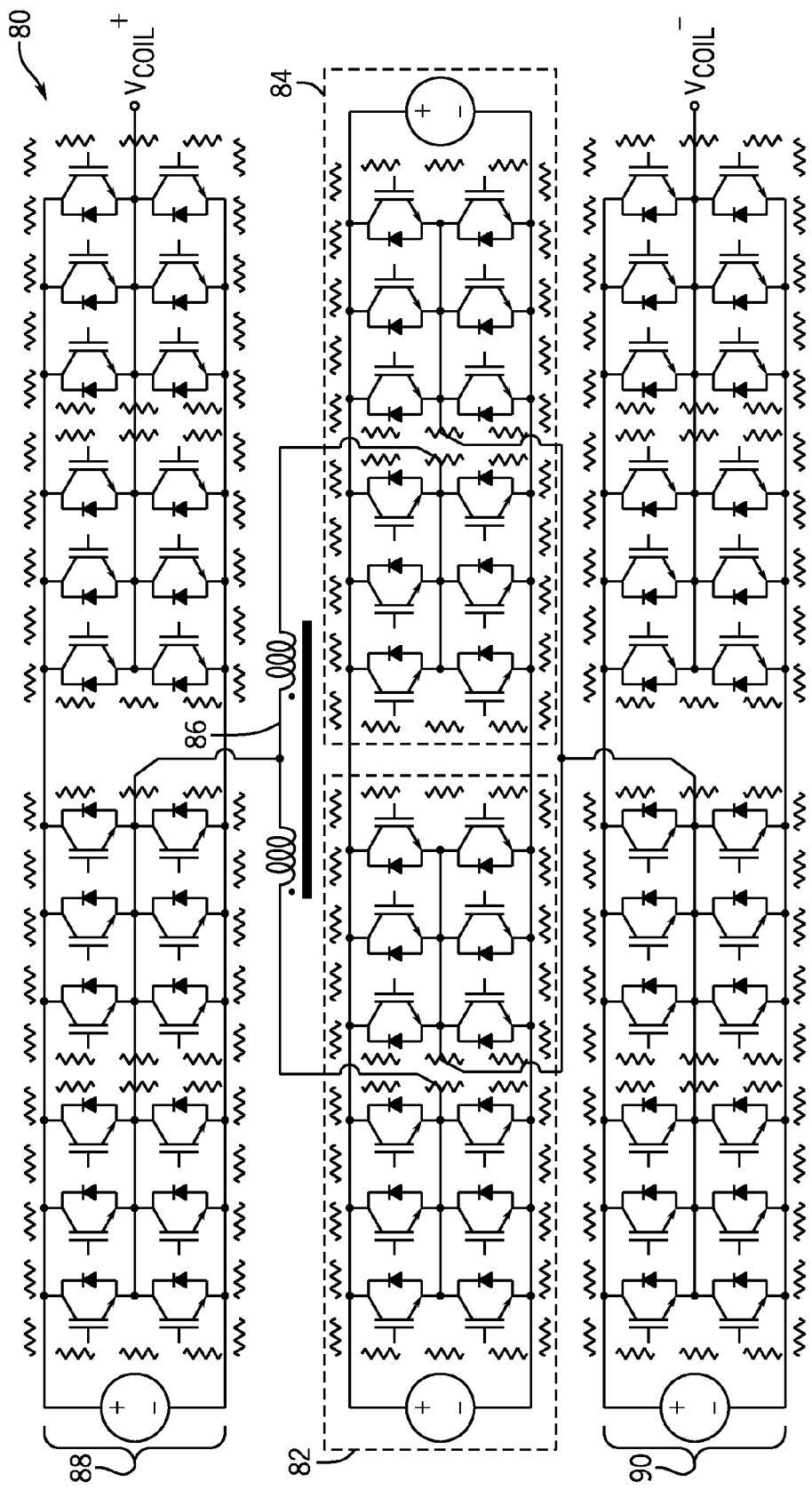
FIG. 3 is a schematic of a gradient driver having a parallel configuration.

Typical MRI systems may have imaging sequence procedures that require fast changes in the gradient coil current. To achieve fast changes in the gradient coil current, it may be necessary to apply a large voltage output across the terminal of the gradient coil. Single series-connected gradient driver configurations may be insufficient for delivering the appropriate output. Furthermore, in some typical systems, gradient drivers may be configured to have multiple driver components coupled in parallel to increase the current capabilities in the gradient coils. An example of a parallel-packaged gradient driver 80, referred to herein as a parallel driver 80, is provided in FIG. 3, where driver components 82 and 84 are coupled in parallel via the transformer 86. The transformer 86 is utilized to ensure proper current sharing between the two driver components 82 and 84. The parallel-coupled driver components 82 and 84 may also be connected in series to two other driver components 88 and 90 in this illustration.

Parallel packaging of driver components may increase the current capabilities in the gradient coil, as the parallel driver 80 may be able to deliver a larger current amplitudes as needed by the imaging sequence procedure. However, due to package parasitics in a parallel connection, current sharing between the semiconductors of different driver components may be uneven. For example, semiconductor switches in the driver components 82 and 84 may operate much faster than switches in the other driver components 88 and 90. Uneven current sharing between semiconductors may lead to electrical losses and thermal instability of the parallel driver 80. In some implementations, thermal instability may limit the number of semiconductor packages which can reliably be connected in parallel. Due to mismatches in the thermal coefficient of typical semiconductors (which may often be a negative thermal coefficient) used in gradient drivers, the performance of the semiconductors may be less predictable or efficient due when temperatures fluctuate. Thermal instability may also result in thermal runaway, which may lead to semiconductor damage and decreased efficiency or functioning of the parallel driver 80. Efforts directed towards preventing such potential thermal instability of the parallel driver design may increase the complexity and cost of the design.

Furthermore, a typical parallel-packaged gradient driver 80 may be designed such that all switching semiconductors are operating (e.g., switching on and off), even when not all switching semiconductors are necessary to deliver a particular pulse sequence to the gradient coils. For example, the parallel driver 80 may be designed to have the number of driver components (e.g., 82, 84, 88, and 90), each with a number of switching semiconductors necessary to deliver the maximum output which may be required by the gradient coils in a particular MRI system. A particular imaging application of the MRI system may require a pulse sequence with a large dynamic range, such that the gradient coils do not always require a maximum output from the parallel driver 80. When a maximum output is not required from the gradient driver, it may not be necessary for all driver components to be operating (e.g., switching on and off). However, a typical parallel-packaged gradient driver 80 is generally not configured to selectively utilize certain driver components. Thus, all the switching semiconductors in the parallel driver 80 may be constantly switching on and off. The constant switching in semiconductors, which may be unnecessary for delivering a needed output, may contribute to unnecessary electrical loss in the system.

In accordance with the one or more embodiments disclosed herein, electrical losses in the MRI system 10 may be reduced and/or distributed among one or more driver components of the gradient driver 58 (as in FIG. 1), thus improving the efficiency of the gradient driver 58. Further, in some embodiments, the precision of the pulse sequence delivered by the gradient driver and the thermal stability of the gradient driver 58 may be improved.

In one embodiment, a gradient driver 58 may include two interleaved drivers configured to deliver an output at less than a maximum current used by the gradient coils 26, 28, and 30. For example, in some embodiments, each of the interleaved drivers may be configured to deliver an output that is approximately half the maximum current amplitude. Thus, the two interleaved drivers of the gradient driver 58 may operate concurrently to deliver a pulse sequence having a ripple at twice the switching frequency, and hence having smaller output filter requirements. As the output required for each of the interleaved drivers may be reduced (e.g., approximately half the maximum amplitude), the interleaved drivers may share the load and electrical losses may be distributed among the two drivers.

Further, when only one interleaved driver may be sufficient for delivering certain portions of the pulse sequence, the interleaved gradient driver design may allow for the operation of only one interleaved driver, thus saving electrical loss which would have been incurred had both drivers been operating. In some embodiments, the two drivers may also alternate their operation in time, which may also decrease the electrical loss in the driver 58 and/or maintain an acceptable junction temperature in the driver 58. Operation modes which maintain lower semiconductor temperatures may simplify the design requirements of a thermal management subsystem of the gradient driver 58 and/or other components of the MRI system 10.

Figure 4:
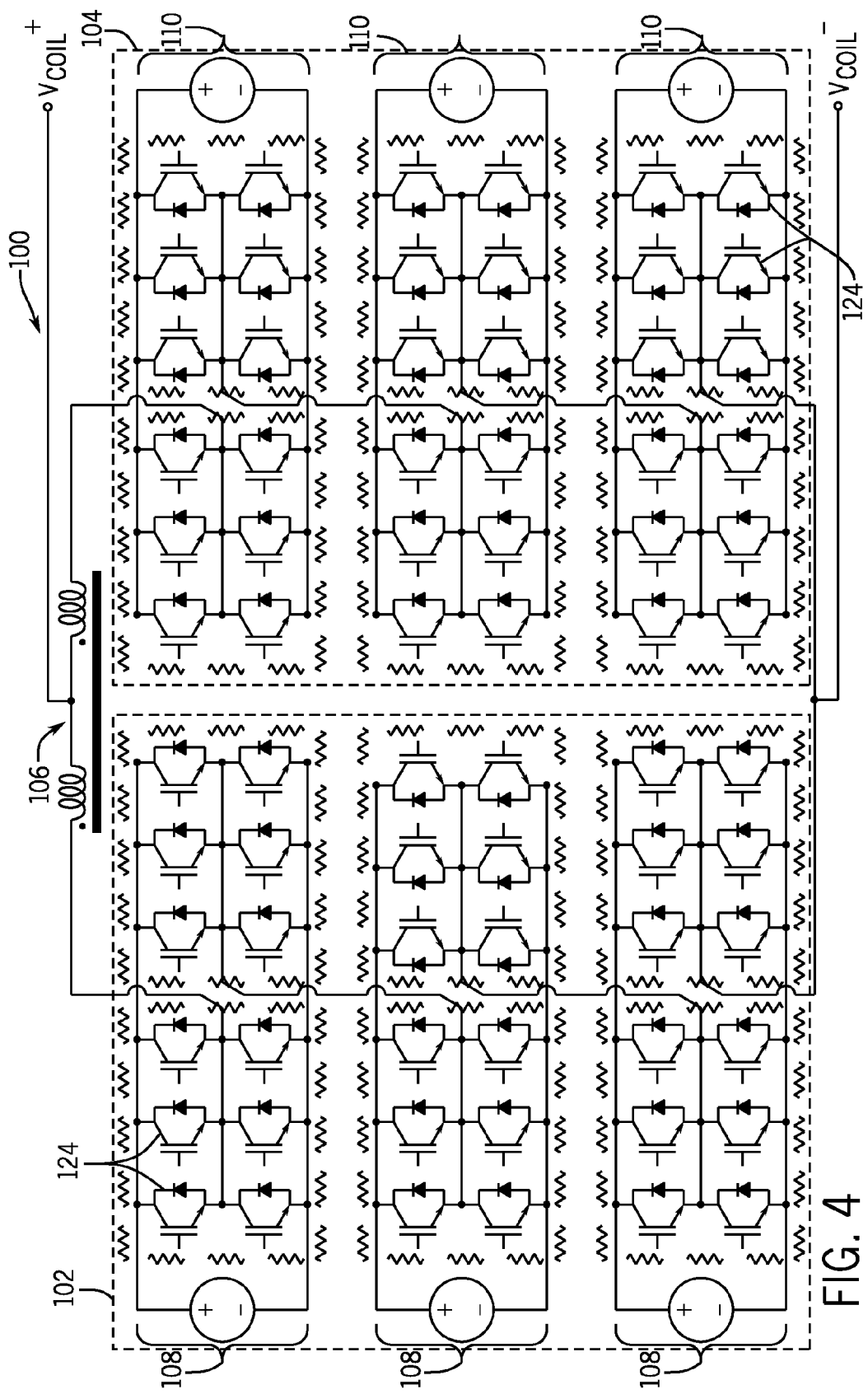
FIG. 4 is a schematic of a 2-3 level series gradient driver in accordance with an aspect of the present disclosure.

An example of an interleaved gradient driver 58 is provided in the 2-3 level gradient driver 100 of FIG. 4. The 2-3 level driver 100 may have two 3-level drivers 102 and 104, each having driver components 108 and 110, respectively, arranged in series. The two 3-level drivers 102 and 104 are then coupled via the transformer 106. The transformer 106 may a current sharing magnetic element suitable for balancing current in both halves (i.e., each of the 3-level drivers 102 and 104) of the 2-3 level gradient driver 100. The 3-level drivers 102 and 104 may also be referred to as interleaved drivers 102 and 104, and, while three levels of driver components 108 and 110 are illustrated in FIG. 4, in accordance with different embodiments of this disclosure, an interleaved driver 102 or 104 may have any number of driver components 108 or 110. Further, while each of the driver components 108 and 110 illustrate a certain number of switching semiconductors, the driver components 108 and 110 may have any number of switching semiconductors. A gradient driver in accordance with present embodiments may also include more than two interleaved drivers. For example, some MRI applications may use even more current in the gradient coils, and in one embodiment, a gradient driver may include three or more interleaved drivers.

Each of the two interleaved drivers 102 and 104 may be rated to deliver less than the maximum amplitude of a pulse sequence required by the gradient coils 26, 28, and 30 in the system 10 (FIG. 1). In some embodiments, each of the two interleaved drivers 102 and 104 may be rated to deliver approximately half of the maximum amplitude required by the gradient coils. When the gradient coils require a pulse amplitude that can be delivered by one of the interleaved drivers 102 or 104, only one of the interleaved drivers 102 or 104 (e.g., interleaved driver 102) may operate to deliver the necessary output. Thus, rather than utilizing both interleaved drivers 102 or 104 unnecessarily, the operating losses which would have been incurred on the interleaved driver not operating (e.g., interleaved driver 104) may be saved.

If and when the gradient coils 26, 28, and 30 require an output that cannot be sufficiently delivered by only one of the interleaved drivers 102 or 104, both of the interleaved drivers 102 and 104 may operate, and the electrical losses may be distributed among the two interleaved drivers 102 and 104. As the driver components 108 and 110 are arranged linearly within each interleaved driver 102 and 104, driver components 108 and/or 110 may be selected to operate as necessary. In one embodiment, when both interleaved drivers 102 and 104 are in operation, the 2-3 level gradient driver 100 may be suitable for delivering approximately 2000 V to the gradient coils 26, 28, and 30.

The interleaved driver configuration may enable each interleaved driver 102 and 104 to output a smaller current while still delivering the required pulse sequence to the gradient coils 26, 28, and 30. Delivering a smaller current output at each interleaved driver 102 and 104 may also improve the accuracy of the pulse sequence, enabling faster changes in the current utilized by the coils 26, 28, and 30. Due to characteristics of the switching semiconductors 124 used in typical gradient drivers, switching responsiveness decreases when the drivers use semiconductors rated for higher voltages. As the switching semiconductors must be constantly switching on and off to deliver the appropriate waveform of the required pulse sequence, slower switching may result in slower changes in the pulse sequence required by the gradient coils. The responsiveness of the switching semiconductors may therefore affect the quality and resolution of the image produced by the MRI system 10.

Using the interleaved driver configuration, lower currents may be output from each interleaved driver 102 and 104 such that faster switching semiconductors 124 may be used to achieve a more responsive system for outputting a particular pulse sequence required by the gradient coils 26, 28, and 30. Fast responsiveness of the semiconductors 124 may be important to providing a high resolution pulse sequence, as the required pulse sequence may be widely dynamic over the duration of the sequence.

In some embodiments, the switching semiconductors may be an insulated gate bipolar transistor (IGBT). However, in other embodiments, other types of switching semiconductors are also envisioned. For example, metal-oxide-semiconductor field-effect-transistors (MOSFETs) may also be suitable. Further, decreasing voltage requirements for the interleaved drivers 102 and 104 enables more flexibility in selecting a suitable switching semiconductor for the driver design, as different types of semiconductors may become available. It is envisioned that advanced semiconductors having reliable switching characteristics at higher voltages will lead to driver designs requiring less levels (e.g., less stacks of driver components).

In some embodiments, the two interleaved drivers 102 and 104 of the 2-3 level gradient driver 100 may also alternate in operation to further manage and/or distribute electrical losses in the system. For example, the control circuit 36 or the gradient coil controller 40 may manage the two interleaved drivers 102 and 104 such that they switch in operation after some duration (assuming only one interleaved driver 102 or 104 is sufficient for outputting the pulse sequence in the duration). Such a mode of operation may switch the electrical loss between the two alternating interleaved drivers 102 and 104, such that not all electrical losses are incurred in one portion of the 2-3 level gradient driver 100. Different embodiments may include any combination of alternating operations between two interleaved drivers 102 and 104.

The interleaved gradient driver design may also improve thermal stability and save potential costs in thermal management design. As previously discussed with respect to the parallel-packaged driver 80 in FIG. 3, parallel packaging may result in uneven current sharing. Such current imbalances may lead to thermal instability, which may lead to operating inefficiencies, and possible degradation of driver components. However, in accordance with the present embodiments, current in the two interleaved drivers 102 and 104 may be evenly distributed by the transformer 106, such that current is balanced in the 2-3 level driver 100 when both interleaved drivers 102 and 104 are operating. Decreasing the possibility of thermal instability may reduce costs in designing a gradient driver. For example, while some gradient drivers utilize costly cooling methods for extracting heat from the system, in accordance with present embodiments, simpler and less costly cooling methods may be employed. In some embodiments, water cooling techniques, or even less expensive air cooling techniques may be employed.

Figure 5:
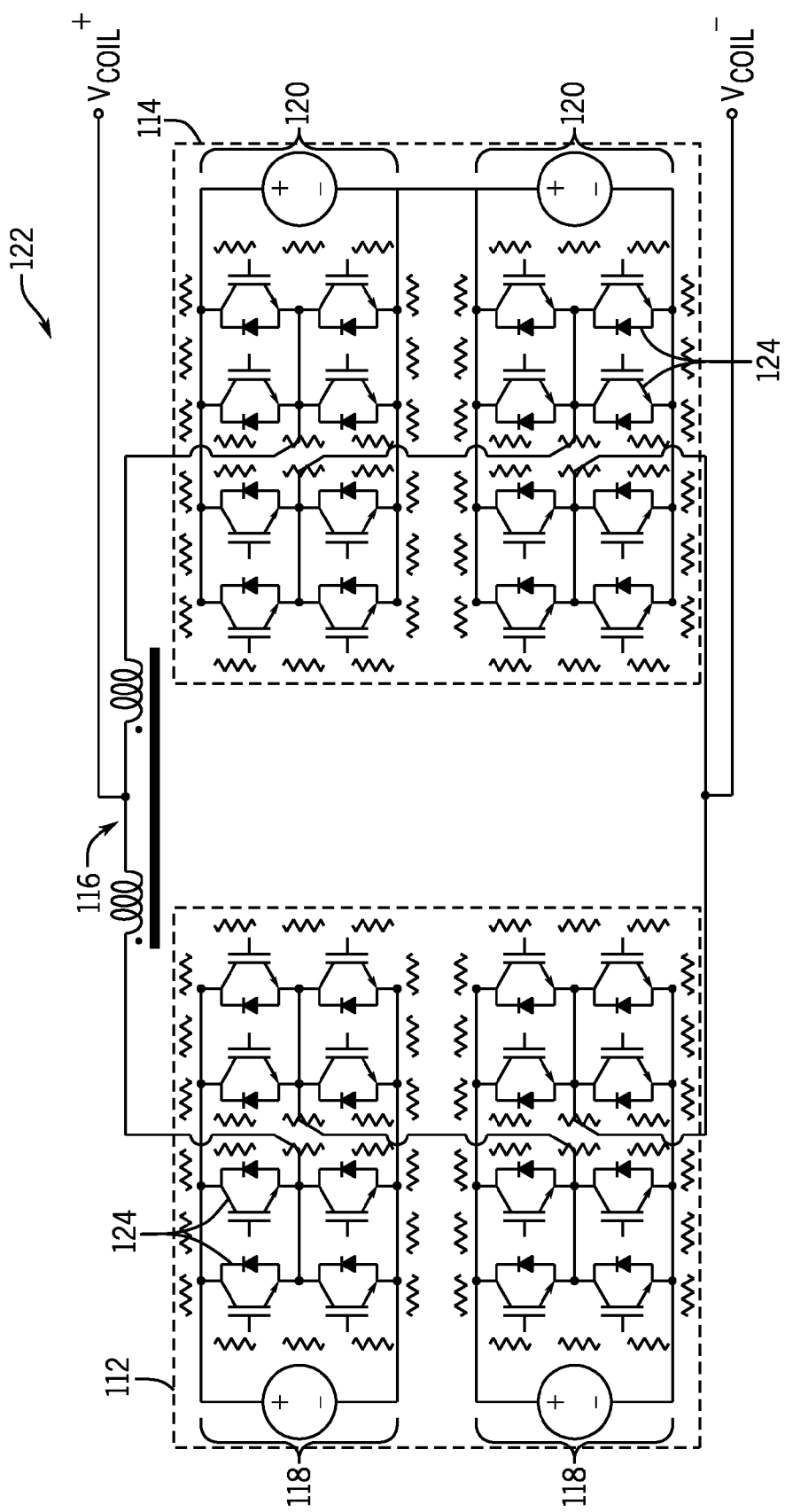
FIG. 5 is a schematic of a 2-2 level series gradient driver in accordance with an aspect of the present disclosure.

Further, as the interleaved design enables thermal stability and distributed electrical losses, driver designs having fewer driver components may also be envisioned. In one embodiment, a gradient driver may have two interleaved drivers 112 and 114, each having two driver components 118 and 120, respectively, as illustrated in the schematic of the 2-2 level gradient driver 122 in FIG. 5. As depicted in FIG. 5, the 2-2 level gradient driver 122 may have fewer driver components 118 and 120, and fewer switching semiconductors 124, as the interleaved driver design may enable a simpler design by using semiconductors capable of operating with higher supply voltages.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A magnetic resonance imaging (MRI) system comprising:
    a gradient coil disposed cylindrically around a scanning volume; and
    two or more interleaved gradient drivers coupled in parallel with one another and coupled to the gradient coil through a transformer, wherein each of the two or more interleaved gradient drivers is configured to deliver less than a maximum amplitude of a current utilized by the gradient coil and wherein each interleaved gradient driver, of the two or more interleaved gradient drivers, itself comprises:
        at least two levels of driver components coupled in series with one another, wherein each level of the at least two levels of driver components comprises a voltage source; and
        a terminal coupled to the transformer; and
    wherein the parallel coupling between the two or more interleaved gradient drivers is such that the respective at least two levels of driver components of each interleaved gradient driver are coupled in parallel with the respective at least two levels of driver components of all other interleaved gradient drivers of the two or more interleaved gradient drivers.

2. The MRI system of claim 1, wherein each of the two or more gradient drivers is configured to deliver approximately one half of the maximum amplitude.

3. The MRI system of claim 1, whereby when one interleaved gradient driver is sufficient for providing the current utilized by the gradient coil, only the one of the two or more interleaved gradient drivers is in operation.

4. The MRI system of claim 3, whereby when the one interleaved gradient driver is insufficient for providing the current utilized by the gradient coil, more than one of the two or more interleaved gradient drivers is in operation.

5. The MRI system of claim 1, wherein the two or more interleaved gradient drivers each comprise a plurality of switching semiconductors.

6. The MRI system of claim 5, wherein the switching semiconductors comprise insulated gate bipolar transistors (IGBTs).

7. The MRI system of claim 1, comprising control circuitry capable of controlling an operation of the two or more interleaved gradient drivers.

8. The MRI system of claim 7, wherein the control circuitry is configured to alternate the operation of the two or more interleaved gradient drivers.

9. The MRI system of claim 1, wherein the two or more interleaved gradient drivers are coupled together via the transformer in order to ensure proper current sharing between the two or more interleaved gradient drivers.

10. A magnetic resonance imaging (MRI) system comprising:
    a gradient coil disposed cylindrically around a scanning volume;
    a gradient driver coupled to the gradient coil and configured to deliver pulse sequences to the gradient coil, wherein the gradient driver itself comprises:
        a first interleaved driver comprising:
            first and second levels of driver components comprising first and second respective voltage sources and first and second respective pluralities of switches; and
        a second interleaved driver coupled in parallel to the first interleaved driver through a transformer coupled to respective terminals of the first and second interleaved drivers, the second interleaved driver comprising:
            third and fourth levels of driver components comprising third and fourth respective voltage sources and third and fourth respective pluralities of switches; and
    control circuitry coupled to the gradient driver, wherein the control circuitry is configured to control an operation of the first interleaved driver and the second interleaved driver.

11. The MRI system of claim 10, wherein each of the first interleaved driver and the second interleaved driver are configured to output approximately half a maximum amplitude of a current utilized by the gradient coil.

12. The MRI system of claim 10, wherein the control circuitry operates the first interleaved driver and not the second interleaved driver when the first interleaved driver is sufficient in order to deliver a current utilized by the gradient coil.

13. The MRI system of claim 10, wherein the control circuitry operates the first interleaved driver and the second interleaved driver together when an amplitude greater than a maximum output from either the first or second interleaved drivers is required by the gradient coil.

14. The MRI system of claim 10, wherein the pulse sequences comprise current outputs from the gradient driver to the gradient coil.

15. The MRI system of claim 10, wherein the pulse sequences each comprise a variable length and a dynamic range.

16. The MRI system of claim 10, wherein the gradient driver is configured in order to output approximately 2000 V.

17. A gradient coil driver configured to interface with a gradient coil of a magnetic resonance imaging system, wherein the gradient coil itself comprises:
a first interleaved driver comprising:
a first plurality of levels coupled in series with one another, each level of the first plurality of levels comprising a respective first voltage source and a respective first plurality of switching semiconductors; and
a second interleaved driver comprising:
a second plurality of levels coupled in series with one another, each level of the second plurality of levels comprising a respective second voltage source and a respective second plurality of switching semiconductors, wherein the second interleaved driver is coupled to the first interleaved driver in parallel via a transformer such that the first plurality of levels is coupled in parallel with the second plurality of levels, and the transformer is configured in order to balance a current flow through the first interleaved driver and the second interleaved driver.

18. The gradient coil driver of claim 17, wherein the first interleaved driver is configured to operate alternately from the second interleaved driver.

* * * * *